United States Patent
Buchanan et al.

(10) Patent No.: US 6,436,196 B1
(45) Date of Patent: Aug. 20, 2002

(54) APPARATUS AND METHOD FOR FORMING AN OXYNITRIDE INSULATING LAYER ON A SEMICONDUCTOR WAFER

(75) Inventors: Douglas A. Buchanan, Cortlandt Manor; Evgeni P. Gousev, Yorktown Heights; Carol J. Heenan, LaGrangeville, all of NY (US); Wade J. Hodge, Bolton; Steven M. Shank, Jericho, both of VT (US); Patrick R. Varekamp, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/887,505

(22) Filed: Jun. 22, 2001

Related U.S. Application Data

(63) Continuation of application No. 09/803,503, filed on Mar. 9, 2001, now Pat. No. 6,346,487.

(51) Int. Cl.[7] .......................... H01L 21/31; H01L 21/469
(52) U.S. Cl. ........................ 118/725; 118/715; 118/719; 438/773; 438/774
(58) Field of Search .................................. 118/715, 719, 118/725; 438/770, 773, 774

(56) References Cited

U.S. PATENT DOCUMENTS

| | | | |
|---|---|---|---|
| 5,434,090 A | * 7/1995 | Chiou et al. ................. 437/10 |
| 5,464,792 A | 11/1995 | Tseng et al. | |
| 5,541,436 A | 7/1996 | Kwong et al. | |
| 5,589,231 A | * 12/1996 | Hauge et al. ................ 427/561 |
| 5,880,040 A | 3/1999 | Sun et al. | |
| 5,960,302 A | 9/1999 | Ma et al. | |
| 5,972,804 A | 10/1999 | Tobin et al. | |
| 5,990,014 A | * 11/1999 | Wilson et al. ............... 438/706 |
| 5,998,270 A | 12/1999 | Gilmer et al. | |
| 6,017,791 A | 1/2000 | Wang et al. | |
| 6,037,224 A | 3/2000 | Buller et al. | |
| 6,303,522 B1 | * 10/2001 | Mertens et al. ............. 438/774 |
| 6,346,487 B1 | * 2/2002 | Buchanan et al. ........... 438/774 |

* cited by examiner

Primary Examiner—Alexander G. Ghyka
(74) Attorney, Agent, or Firm—DeLio & Peterson, LLC; Robert Curcio; William D. Sabo

(57) ABSTRACT

An apparatus and method of forming an oxynitride insulating layer on a substrate performed by putting the substrate at a first temperature within the main chamber of a furnace, exposing the substrate to a nitrogen containing gas at a second temperature which is higher than the first temperature, and growing the oxynitride layer on the substrate within the main chamber in the presence of post-combusted gases. The higher temperature nitrogen containing gases are combusted in a chamber outside the main chamber. The higher temperature is in the range of 800 to 1200° C., and preferably 950° C. In a second embodiment, distributed $N_2O$ gas injectors within the main chamber deliver the nitrogen containing gas. The nitrogen containing gas is pre-heated outside the chamber. The nitrogen containing gas is then delivered to a gas manifold that splits the gas flow and directs the gas to a number of gas injectors, preferably two to four injectors within the main process tube. Gas injection orifices on the order of several millimeters then distribute the pre-decomposed gas to the wafers, producing a more uniformly N-doped wafer load in a batch furnace.

9 Claims, 2 Drawing Sheets

APPARATUS AND METHOD FOR FORMING AN OXYNITRIDE INSULATING LAYER ON A SEMICONDUCTOR WAFER

This is a continuation of application(s) Ser. No. 09/803, 503 filed on Mar. 9, 2000 now U.S. Pat. No. 6,346,487.

BACKGROUND OF THE INVENTION

1. Field of the Invention

The present invention relates generally to the fabrication of semiconductor wafers. More particularly, the invention relates to an apparatus and method for employing nitrogen oxide (NO) or $N_2O$ gases to dope silicon dioxide in a furnace at high temperatures to form oxides and oxynitrides layers on a semiconductor for gate dielectrics.

2. Description of Related Art

The ability to use silicon dioxide ($SiO_2$) as the gate dielectric material becomes extremely difficult for thickness ($t_{ox}$) less than twenty (20) angstroms (Å). Thickness as small as 20 angstroms are required for device scaling with channel lengths less than 0.25 microns ($\mu$m). Por thickness less than twenty angstroms, leakage currents may approach 1 A/cm$^2$. This is significant when compared to leakages on the order of $1(10^{-12})$ A/cm$^2$ for thickness $t_{ox}$ greater than 40 angstroms. Thus having a thickness on the order of twenty angstroms may produce prohibitive power consumption of the transistors in the off-state, and reliability concerns through lifetime degradation, i.e., device lifetimes less than ten (10) years.

The leakage current is caused by direct tunneling of electrons from the polysilicon gate electrode through the gate oxide. Boron from the doped poly-silicon gate easily penetrates the thin $SiO_2$ layer causing large $V_t$ shifts and more reliability problems. Boron doped poly-silicon gate electrodes are required to avoid depletion effects which will also cause large $V_t$ shifts and higher threshold voltages. Silicon oxynitrides (SiOxNy) or nitrogen (N) doped $SiO_2$ have been chosen by most integrated circuit chip manufacturers as the material of choice to replace $SiO_2$ for gate dielectrics in the thickness range of 15 to 20 angstroms. The beneficial effects of nitrogen incorporation are dependent upon the magnitude of the doping and the distribution of the doping profile relative to both the Si/$SiO_2$ interface and the poly-silicon gate/$SiO_2$ interface. If the nitrogen doping is engineered correctly, leakage current and boron penetration can be reduced, while minimizing or negating the impact on threshold voltage $V_t$ and channel electron mobility. Additionally, hot-electron defect generation in the silicon channel can be reduced by nitrogen gettering of hydrogen (H). These effects make scaling the gate dielectric down to fifteen (15) angstroms viable, while minimizing the impact on process integration that would occur by changing the gate dielectric to a high dielectric constant (K) material system; the high-K material being different material than the $SiO_2$. The ability to correctly engineer the nitrogen dopant profile is absent in the prior art.

Oxides and oxynitrides for gate dielectrics are typically grown in atmospheric (or reduced pressure) furnaces, where the gas is pre-combusted through a torch injector pre-tube outside of the main process tube. The resultant product is then delivered to the main process tube for reaction with wafers that are pre-processed up to the gate dielectric layer. Typical torch combustion chambers are engineered to pre-heat gas up to 850° C. for combustion of $O_2$ and $H_2$ to form $H_2O$ and $O_2$. $H_2O$ is a critical reactant for wet oxidation in the formation of high quality gate oxides, and has been used extensively as such by the semiconductor industry. The torch is also used to combust chlorine containing sources to provide high purity atomic chlorine that is used as a metal getterer in the furnace process chamber which, along with nitrogen oxide (NO), are the two gases that can be used to thermally grow or anneal high quality oxynitride films. However, torches have not been engineered for $N_2O$ combustion. For example, in U.S. Pat. No. 6,017,791, issued to Wang, et al., entitled, "MULTI-LAYER SILICON NITRIDE DEPOSITION METHOD FOR FORMING LOW OXIDATION TEMPERATURE THERMALLY OXIDIZED SILICON NITRIDE/SILICON OXIDE (NO) LAYER," a method for forming a silicon nitride/silicon oxide (NO) layer within a microelectronics fabrication was introduced. In order to form these layers, Wang uses two deposition methods within the same deposition reactor chamber, with the first deposition method separated from the second deposition method by a vacuum purge of the deposition reactor chamber to assure that the second silicon nitride layer is formed as a discrete silicon nitride layer upon the first silicon nitride layer. Each of the nitride layers in the Wang art are formed through a chemical vapor deposition (CVD) process. By implementing a higher temperature outside the main process tube (chamber), the instant invention eliminates, among other things, the vacuum purge of the deposition reactor chamber.

Nitrogen oxide is not typically used since it requires additional safety apparatus due to its toxicity. It can also produce certain undesirable electrical properties of the device, such as low electron channel mobility, large voltage threshold shifts, and hot-electron degradation effects.

The present invention introduces a thermal nitrogen dopant tuner and its ability to make use of the $N_2O$ decomposition mechanisms to fabricate transistors with thickness in the ten to twenty angstrom regime.

Bearing in mind the problems and deficiencies of the prior art, it is therefore an object of the present invention to provide an apparatus and method for utilizing $N_2O$ decomposition mechanisms to make transistors with thickness as small as ten to twenty angstroms.

It is another object of the present invention to provide an apparatus and method for using $SiO_2$ as a gate dielectric material for thickness on the order of 10–20 Å.

A further object of the invention is to provide an apparatus and method for having a substrate with a gate dielectric thickness less than 20 Å without producing prohibitive power consumption due to leakage current losses.

It is yet another object of the present invention to provide an apparatus and method for developing nitrogen doped $SiO_2$ substrate layers to replace $SiO_2$ layers as ate dielectrics with thickness on the order of 10–20 Å.

Another object of the invention is to provide an apparatus and method for reducing leakage current and boron penetration of the $SiO_2$ layer while negating the impact on threshold voltage and channel electron mobility.

A further object of the invention is to provide an apparatus and method for scaling gate dielectrics down to the 10–20 Å regime while minimizing the impact on process integration.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method of forming an insulating layer on a substrate comprising pre-combustion of nitrogen containing gas outside a furnace having a main chamber, the pre-combustion performed at a temperature higher than that within the main chamber, wherein the nitrogen containing gas includes $N_2O$ or NO.

In a second aspect, the instant invention is directed to a method of tuning the magnitude of nitrogen doped profiles for an oxynitride insulator on a substrate, the method comprising: providing the substrate at a first temperature within a main chamber; exposing the substrate to a nitrogen containing gas at a second temperature which is higher than the first temperature; and, growing the insulator on the substrate in the presence of the gas. The exposing step further comprises heating the nitrogen containing gas to the second temperature in a second chamber outside the main chamber and directing the heated nitrogen containing gas to the main chamber. The method further comprises heating chlorine and steam gas to a combustion temperature and transferring the chlorine and steam gas to the second chamber. The heating is accomplished by applying a torch heating element to the chlorine and steam gas in a third chamber separate from the main and second chambers. The second temperature is in the range of 800 to 1200° C., preferably 950° C. The first temperature is in the range 600 to 1100° C., or preferably in the range 600 to 800° C. The second temperature is sufficient to react with the gas before it reacts with the substrate. The second temperature is adjusted to tailor an amount of nitrogen concentration in the insulating layer.

In a third aspect, the instant invention is directed to a method for employing a nitrogen containing gas to form an insulation film on a semiconductor, comprising: combusting chlorine and steam gas in a first chamber; transporting the combusted chlorine and steam gas to a second chamber; applying heat to the second chamber to the chlorine and steam gas; removing the chlorine and steam gas from the second chamber to a third chamber, and introducing nitrogen containing gas to the second chamber from the first chamber; applying heat to the second chamber to the nitrogen containing gas; transferring the nitrogen containing gas to a third chamber containing the semiconductor; and, applying heat to the third chamber at a temperature level sufficient to initiate a gas-semiconductor reaction wherein a the insulation film is formed on the semiconductor.

In a fourth aspect, the instant invention is directed to a method for distributing a nitrogen containing gas to form an insulation film on a semiconductor, comprising: providing the semiconductor within a main process tube; pre-heating $N_2O$ gas outside the main process tube; delivering the $N_2O$ gas to a gas manifold; splitting the $N_2O$ gas flow through the gas manifold to direct the $N_2O$ gas to gas injectors attached to the main process tube; and, distributing the $N_2O$ gas through the injectors to the main process tube housing the semiconductor.

In a fifth aspect, the instant invention is directed to an apparatus for forming an insulating layer on a substrate comprising: a furnace including: a first chamber having a first heating element for combusting chlorine and steam gas at a first temperature; a second chamber having a second heating element, the second chamber adapted to receive the chlorine and steam gas and separately a nitrogen containing gas at a second temperature; and, a third chamber having a third heating element at a third temperature adapted to react separately the gases from the second chamber with the substrate to grow the insulating layer. The second temperature is higher than the third temperature, such that the combined gases from the second chamber enter the third chamber at a higher temperature than the third temperature.

The first heating element comprises a torch. The second heating element may also be comprised of a torch.

In a sixth aspect, the instant invention is directed to an apparatus for distributing a nitrogen containing gas to form an insulation film on a semiconductor, comprising: a furnace main process tube adapted for gas injection within the tube and securing the semiconductor; a heating element outside the main process tube for pre-heating a nitrogen containing gas; a gas manifold adapted to receive and deliver the pre-heated nitrogen containing gas to gas injectors attached to the main process tube; the gas injectors adapted to distribute the nitrogen containing gas to the semiconductor. The gas injectors include at least two injectors within the main process tube.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
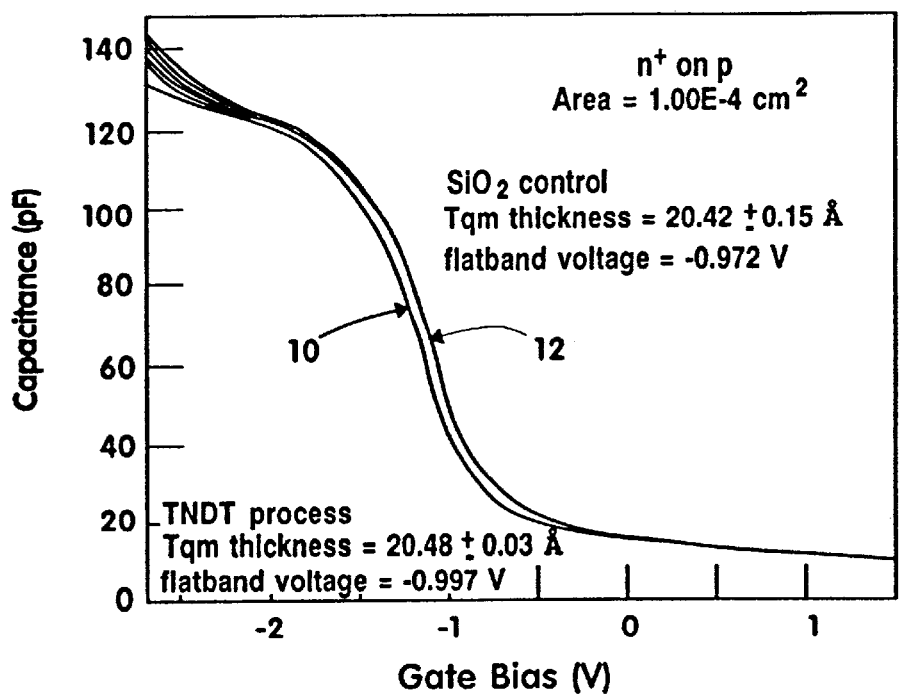
FIG. 1 is a graph of a comparison of capacitance-voltage curves for a thermal nitrogen dopant tuner process and a process using $SiO_2$ control.
Figure 2:
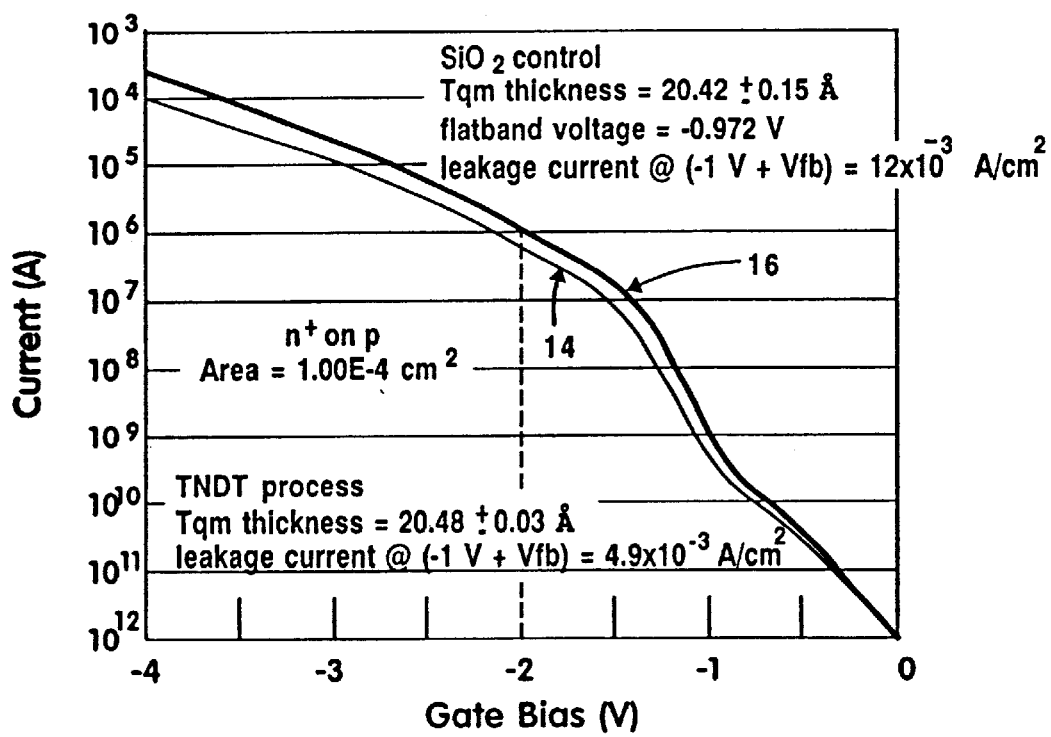
FIG. 2 represents I–V curves for the thermal nitrogen dopant tuner film and the $SiO_2$ control.
Figure 3:
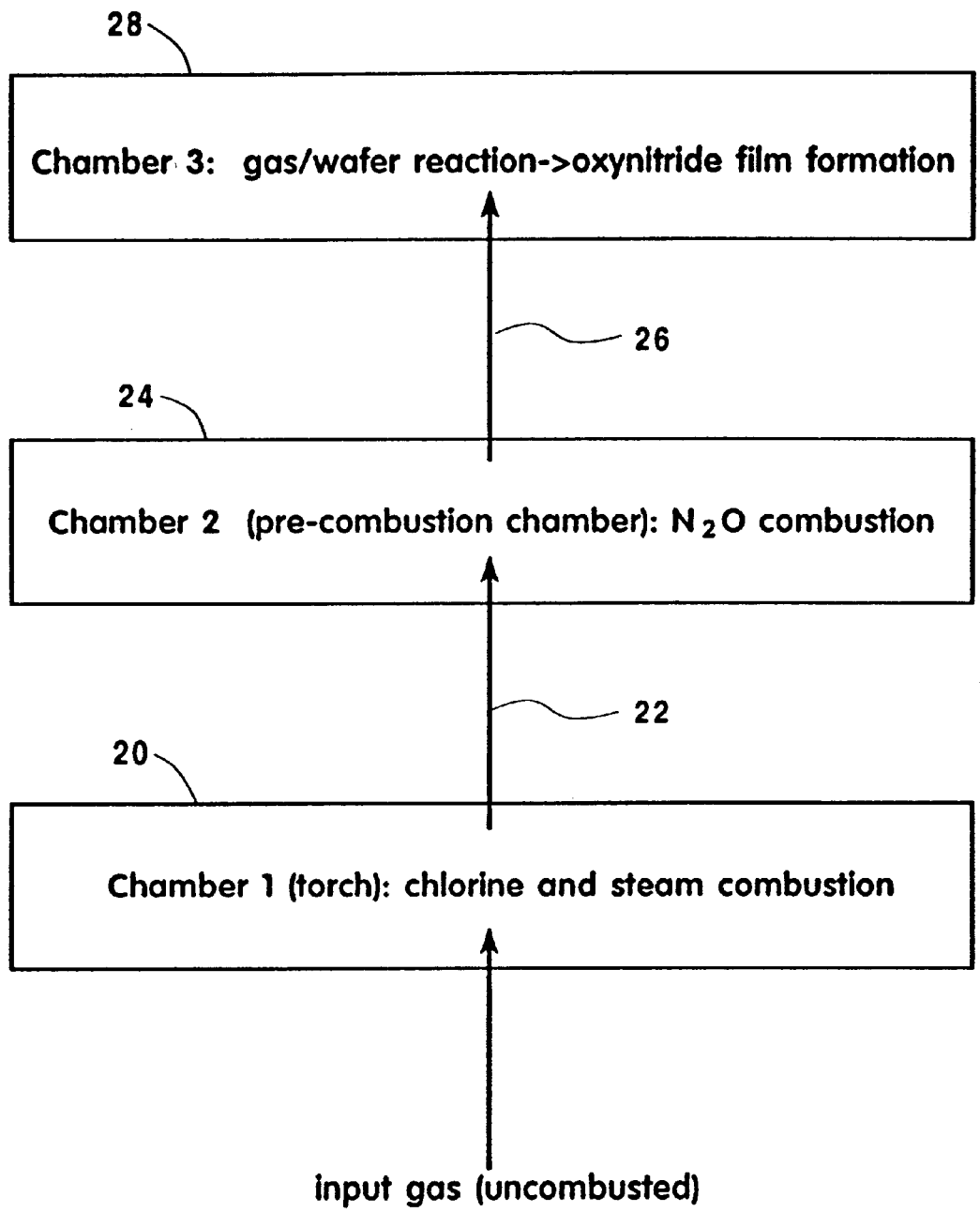
FIG. 3 is a block diagram representing the gas flow through the separate chambers used in the gas flow/reaction sequence of the instant invention.

In describing the preferred embodiment of the present invention, reference will be made herein to FIGS. 1–3 of the drawings in which like numerals refer to like features of the invention. Features of the invention are not necessarily shown to scale in the drawings.

A torch or pre-combustion furnace chamber that is engineered for high temperature combustion is used to tune the magnitude and position of the nitrogen doping profile for oxynitrides. Tuning of the nitrogen profile in an oxynitride gate dielectric can lower the leakage current and boron penetration in a CMOS or BiCMOS structure, while maintaining the same electron channel mobility and keeping the threshold voltage shift to an allowable level. The process of using a torch or precombustion furnace chamber for $N_2O$ combustion has been designated "Thermal Nitrogen Dopant Tuning" (TNDT) and the torch or pre-combustion furnace chamber referred to as the "thermal nitrogen dopant tuner."

The thermal nitrogen dopant tuner consists of a high temperature heating element that can operate in the temperature range of approximately 800° C. to 1200° C. This heating element is used for the pre-combustion of $N_2O$ outside the main chamber or wafer chamber. The location of the heating element prevents combustion of the $N_2O$ in the wafer process chamber. If combustion of the $N_2O$ is performed in the wafer process chamber, thickness non-uniformities of the oxynitride film will result, due to the exothermic nature of the $N_2O$ gas phase decomposition. An exothermic reaction will cause NO, $O_2$, and O to propagate towards the exhaust outlet and across the wafer surface (from the outer wafer radius to the inner wafer radius) as reactive composition components, both within the wafer and within the load non-uniformities. The temperature range of the heating element is critical to the concentration of NO, which is the reactant that incorporates N in the grown film, and increases as the temperature increases. For temperatures greater that 950° C., enough $NO_2$ bi-product can be produced to react with atomic O, thus decreasing the amount of atomic O compared to increasing the percent of NO composition in the gas phase. This decreases the amount of nitrogen (N) removal at the Si/SiOxNy oxynitridation front, causing the doping concentration at this interface to be increased compared to the concentration at lower pre-combustion temperatures. This also allows for independent control of the wafer temperature and gas temperature while providing a plentiful source of NO from $N_2O$ to form oxynitride. The effect is especially advantageous for device structures which require a low thermal budget.

An example film and device structure have been demonstrated using a thermal nitrogen dopant tuner with the desired temperature of 950° C. and a main process tube (main chamber) temperature of 800° C. Electrical thickness uniformities within-wafer (measured using a capacitance-voltage technique) were 0.02 to 0.06 Å. FIG. 1 shows a comparison of capacitance-voltage curves for a thermal nitrogen dopant tuner process 10 and a process using $SiO_2$ control 12 (without a thermal nitrogen dopant tuner). In generating FIG. 1, sixteen devices were measured on both wafers. As indicated by the FIG. 1 curves, excellent uniformity on the order of 0.3 Å or approximately one statistical deviation, and small flatband shift on the order of 25 meV, are exhibited by the thermal nitride dopant tuner oxide. Across load thickness, uniformities were approximately within 0.12 Å for a wafer load of one hundred. Nitrogen incorporation in the film was measured at an integrated concentration of $4(10^{14})$ to $5(10^{14})$ atoms/cm². Oxynitrides formed with $N_2O$ under (typical) pre-combustion temperatures of 800° C. to 850° C. yielded nitrogen concentrations of $1(10^{14})$ to $2(10^{14})$ atoms/cm. Oxynitrides formed with NO yielded nitrogen concentrations of $6(10^{14})$ to $8(10^{14})$ atoms/cm².

This increase in N incorporation using the thermal nitrogen dopant tuner resulted in a two-fold improvement in leakage current, 0.005 A/cm² (at 1 volt reverse bias), versus a leakage current of 0.01 A/cm² without the implementation of the $N_2O$ thermal nitrogen dopant tuner. FIG. 2 represents I–V curves for the thermal nitrogen dopant tuner film 14 and the $SiO_2$ control 16. As indicated by these curves, the leakage current that resulted from the implementation of the thermal nitrogen dopant tuner is reduced from that produced by the $SiO_2$ control process. This leakage current improvement by a factor of two to three times corresponds to the gain of the oxide thickness (or capacitance) by approximately 0.5 to 1 Å. This leakage current is comparable to that produced by oxynitride growth using NO as the gas source. However, for an NO gas source, the mobility and transconductance are degraded due to too much N incorporation. Implementing the $N_2O$ thermal nitrogen dopant tuner exhibited negligible mobility degradation. In addition, the flatband voltage shift was on the order of 20 meV, which remains an acceptably small value.

The leakage current problem has been identified by others skilled in this art, and solutions have been proposed using thermal growth or anneal to form oxynitride, or $N_2$ ion implant into the silicon channel with a subsequent reoxidation to form the nitrogen-rich interfacial layer. The implementation of the thermal nitrogen dopant tuner of the present invention would serve as a replacement of the $N_2$ ion implant process step(s), or in the alternative, enhance its effect on leakage currents. Having the thermal nitrogen dopant tuner external to the wafer process chamber, thickness and dopant non-uniformity defects that occur during decomposition of $N_2O$ in the wafer chamber are no longer produced. The introduction of this tuner in the process also mitigates the toxicity problem that results from using NO, by creating a gas stream that has less NO by-products than pure NO.

The method of forming an insulating layer on a substrate using the thermal nitrogen dopant tuner requires pre-combustion of the $N_2O$ outside the main chamber at a temperature higher than that within the main chamber. Preferably, the main chamber is kept at a temperature in the range of 800° C., while the pre-combustion chamber is in the range of 950° C. FIG. 3 is a block diagram representing the gas flow through the separate chambers used in the gas flow/reaction sequence of the instant invention. Uncombusted gas is applied to a first chamber 20 where a torch is used to combust chlorine and steam. This gas 22 is then transported to a pre-combustion chamber 24 for $N_2O$ combustion. The combusted gas 26 is then delivered to a main chamber 28 for the gas/wafer reaction where an oxynitride film is formed on the wafer. The substrate remains at a temperature within the main chamber where it is exposed to the nitrogen containing gas from the pre-combustion chamber, delivered at a second temperature which is higher than the temperature in the main chamber. The resultant insulator is then grown on the wafer in the presence of this gas.

A second embodiment of the invention considers using distributed $N_2O$ gas injectors within the main chamber or process tube. The $N_2O$ gas is pre-heated outside the chamber, as similarly required in the first embodiment. Next, the $N_2O$ gas is delivered to a gas manifold that splits the gas flow and directs the gas to a number of gas injectors, preferably two to four injectors, within the main process tube. Gas injection orifices on the order of several millimeters then distribute the pre-decomposed gas to the wafers, producing a more uniformly N-doped wafer load in a batch furnace. This apparatus geometry and method of implementation is unique to the application of N-doped $SiO_2$ or oxynitride.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for forming an insulating layer on a substrate comprising:
   a furnace including:
      a first chamber having a first heating element for combusting chlorine and steam gas at a first temperature;
      a second chamber having a second heating element, said second chamber adapted to receive said chlorine and steam gas and separately a nitrogen containing gas at a second temperature; and,
      a third chamber having a third heating element at a third temperature adapted to react separately said gases from said second chamber with said substrate to grow said insulating layer.

2. The apparatus of claim 1 wherein said second temperature is higher than said third temperature, such that the combined gases from said second chamber enter said third chamber at a higher temperature than said third temperature.

3. The apparatus of claim 1 wherein said first heating element comprises a torch.

4. The apparatus of claim 1 wherein said second heating element comprises a torch.

5. The apparatus of claim 1 wherein said second temperature is 950° C.

6. The apparatus of claim 2 wherein said third temperature is in the range 600 to 1100° C.

7. The apparatus of claim 2 wherein said third temperature level is in the range 600 to 800° C.

8. An apparatus for distributing a nitrogen containing gas to form an insulation film on a semiconductor, comprising:

a furnace main process tube adapted for gas injection within said tube and securing said semiconductor;

a heating element outside said main process tube for pre-heating a nitrogen containing gas;

a gas manifold adapted to receive and deliver said pre-heated nitrogen containing gas to gas injectors attached to said main process tube;

said gas injectors adapted to distribute said nitrogen containing gas to said semiconductor.

9. The apparatus of claim 8 wherein said gas injectors include at least two injectors within said main process tube.

* * * * *